(12) United States Patent
Macomber

(10) Patent No.: US 6,643,316 B2
(45) Date of Patent: Nov. 4, 2003

(54) HIGH POWER SURFACE-EMITTING DISTRIBUTED FEEDBACK LASER

(75) Inventor: Steven Henry Macomber, Tucson, AZ (US)

(73) Assignee: Spectra Physics Semiconductor Lasers, INC, Tucson, AZ (US)

(*) Notice: Subject to any disclaimer, the term of this patent is extended or adjusted under 35 U.S.C. 154(b) by 201 days.

(21) Appl. No.: 09/976,937

(22) Filed: Oct. 13, 2001

(65) Prior Publication Data

US 2003/0072345 A1 Apr. 17, 2003

(51) Int. Cl.[7] .................................................. H01S 5/18
(52) U.S. Cl. ............................................................ 372/96
(58) Field of Search ............................. 372/96, 46, 50, 372/102

(56) References Cited

U.S. PATENT DOCUMENTS

| 4,744,089 | A | | 5/1988 | Montroll | 372/50 |
|---|---|---|---|---|---|
| 5,164,956 | A | * | 11/1992 | Lang | 372/96 |
| 5,241,556 | A | | 8/1993 | Macomber | 372/96 |
| 5,307,183 | A | | 4/1994 | Macomber | 359/11 |
| 5,345,466 | A | | 9/1994 | Macomber | 372/96 |
| 5,442,650 | A | | 8/1995 | Macomber | 372/96 |
| 5,867,521 | A | | 2/1999 | Macomber | 372/96 |
| 5,930,278 | A | * | 7/1999 | Menigaux | 372/50 |
| 6,556,611 | B1 | * | 4/2003 | Khalfin et al. | 372/102 |

* cited by examiner

Primary Examiner—James Davie
(74) Attorney, Agent, or Firm—Howard R. Popper

(57) ABSTRACT

A surface-emitting distributed feedback (SEDFB) laser is provided with a "fan-shaped" grating comprising a group of generally straight lines radiating from a central point that is away from the center of the gain. Such a grating provides better stability against self-induced filamentation and dynamic instabilities that limit achievable beam quality, especially in lasers having a stripe length greater than 1 mm.

10 Claims, 2 Drawing Sheets

4,744,089)

5,345,466)

5,867,521)

5,867,521)

HIGH POWER SURFACE-EMITTING DISTRIBUTED FEEDBACK LASER

FIELD OF THE INVENTION

The present invention relates to distributed feedback lasers, and more particularly, to a surface-emitting distributed feedback (SEDFB) laser having gratings.

BACKGROUND OF THE INVENTION

A surface emitting distributed feedback semiconductor laser is a device that produces unidirectional, monochromatic, coherent visible light through stimulated emission in semiconductor materials. Such a device has a positively doped side and a negatively doped side that are joined at a junction, and a grating that is etched into an outer surface of the positively doped side. The surface of the grating, upon which a strong conductive material is disposed, provides a means by which coherent photon energy fields may be diffracted. A second order grating design permits deflections of coherent photon radiation to be directed normal to an output window etched into the negatively doped side of the junction through first order diffraction, and directed parallel to the surface of the grating through second order diffraction. The first order diffraction produces a beam of unidirectional, monochromatic, coherent visible light at the output window, whereas the second order diffraction provides a feedback of photon radiation to an active region that is adjacent and parallel to the surface of the grating.

The prior art has employed gratings that were straight line, curved and chirped in order to improve the stability and beam quality of surface-emitting distributed feedback (SEDFB) lasers. Surface-emitting distributed feedback lasers with straight rule gratings are shown in U.S. Pat. No. 4,744,089, depicted in FIG. 1a herein; constant radius curved gratings are described in U.S. Pat. No. 5,307,183, FIG. 1b herein; those with variable radius curved gratings are described in U.S. Pat. No. 5,867,521, FIGS. 1c and 1d herein; those with chirped gratings are described in U.S. Pat. No. 5,238,531; and arrays of gratings are disclosed in U.S. Pat. No. 5,307,183, FIG. 1e. FIGS. 1b through 1d were issued to the present inventor. Surface-emitting distributed feedback laser with straight gratings are also described in "Surface emitting distributed feedback semiconductor laser", by S. H. Macomber et al., Appl. Phys. Lett., vol. 51, pp. 472–474, 1987; "AlGaAs surface emitting distributed feedback semiconductor laser", by S. H. Macomber et al., Proc. SPIE, vol. 893, pp. 188–194, 1988; "Two-dimensional surface emitting distributed feedback laser arrays", IEEE Photon. Lett. vol. 1, pp. 202–204, 1989, by J. S. Mott et al.; "Analysis of grating surface emitting lasers", IEEE J. Quant. Electron., vol. 26, pp.456–465 (1990), by R. J. Noll et al.; "Non-linear analysis of surface emitting lasers distributed feedback lasers", IEEE J. Quant. Electron., vol. 26, pp. 2065–2074,1990, by S. H. Macomber et al.; and "Recent developments in surface-emitting distributed feedback arrays", Proc. SPIE, vol. 1219, pp. 228–232,1990, by S. H. Macomber et al.

As shown in FIGS. 1a through 1e 1a through 1e, prior art devices have used the variously patterned types of gratings 30 and devices with such grating patterns have achieved some increase in laser power and stability when the laser stripe length 31 is less than 1 mm. However, such prior art grating patterns have not proven effective in lasers having a stripe length 31 longer than about 2 mm. While the maximum achievable power from a semiconductor laser can be increased by increasing the width of the stripe, it has long been known that the beam quality of wide stripe semiconductor lasers is usually many times the diffraction limit. This is described in "A GaAsAl$_x$ Ga$_{1-x}$ As double-heterostructure planar stripe laser", H. Yonezu et al., in Japan. J. Appl. Phys., vol. 12., pp. 1585–1592, 1973, for example. The beam quality problem is caused by self-induced waveguiding that arises from a combination of spatial hole burning and index antiguiding (i.e., the index of refraction of the medium tends to decrease when the local carrier density increases) forming self-guiding filaments. This is described in "Observation of self-focusing in stripe geometry semiconductor lasers and the development of a comprehensive model of their operation", by P. A. Kirby et al., IEEE J. Quant. Electron., vol. QE-13, pp. 705–719, 1977. An initially flat wavefront propagating along a uniform wide stripe tends to break up into self-perpetuating filaments that lead to poor beam quality which worsens as drive current is increased. This is described in "Spatial evolution of filaments in broad area laser amplifiers", Appl. Phys. Lett., by R. J. Lang et al., vol. 62, pp. 1209–1211, 1993.

Unstable resonators have been used with a variety of high power lasers. They produce a high degree of lateral mode selectivity with a mode that fills a large gain region and are relatively insensitive to intracavity index aberrations. This is described in "Unstable optical resonators", by A. E. Siegman, in Appl. Opt., vol. 13, pp. 353–367, 1974. These characteristics combined with curved (expanding) internal wavefronts that can suppress filamentation makes the unstable resonator approach well-suited to the problem of lateral mode control in broad area semiconductor lasers. Unstable resonator Fabry-Perot devices have demonstrated good lateral beam quality. This is described in "High power, nearly diffraction limited output from a semiconductor laser with an unstable resonator", by M. L. Tilton et al., IEEE J. Quant. Electron., vol. QE-27, pp. 2098–2108, 1991, and "Fabrication of unstable resonator diode lasers", by C. Largent et al., Proc. SPIE, vol. 1418, pp. 40–45, 1991. However, fabrication of curved mirrors with required surface smoothness has been problematic.

While resort to the foregoing prior art techniques has resulted in some improvement in small lasers, they have not been able to improve the stability of wide stripe, high power lasers having a stripe length above about 1 mm. Accordingly, Therefore, it is an objective of the present invention to provide for a surface-emitting distributed feedback laser having gratings that overcomes the problems associated with conventional surface-emitting distributed feedback lasers.

SUMMARY OF THE INVENTION

In order to meet the above and other objectives, the present invention provides for a surface-emitting distributed feedback (SEDFB) laser with a "fan-shaped" grating comprised of substantially straight lines radiating from an origin far away from the center of the gain region. The use of the fan-shaped grating produces good beam quality from broad area SEDFB lasers with high power and high efficiency in lasers having a stripe length of several millimeters.

In general, a grating with non-constant periodicity may be described mathematically by a function $\Phi(y, z)$ that represents the deviation of the grating from uniform spacing, and which can be expressed in units of grating phase. This deformation function may conveniently be expressed as a bi-polynomial expansion:

$$\Phi(y, z) = \sum_{m,n} C_{m,n} y^n z^m \quad (1)$$

The fan-shaped grating is represented by a deformation function whose dominant term has a form corresponding to yz. The grating deformation function (1) may advantageously also have additional terms that improve output beam quality of the laser, such as a chirp ($z^2$) term and higher order aberration correction terms that optimize the beam quality. The present invention overcomes a fundamental problem in semiconductor lasers, namely self-induced filament formation and dynamic instabilities that limit achievable beam quality for very high power devices. Based on numerical simulation, the fan-shaped grating leads to a laser design which is stable for very long (e.g., 4 mm) and wide stripe lengths which do not exhibit filamentation. The effectiveness of the fan grating can be understood in terms of the way filaments are created. In prior art curved grating designs, such as shown in FIG. 1d, the curvature of the grating away from the center of the stripe area leaves the central stripe area with a predominantly parallel grating. This parallel grating region tends to encourage filament formation, whereas the curved regions to either side of the central area tend to cause the beam to walk off the stripe. In contrast, the fan shape grating has no region where the grating exhibits parallel lines. Accordingly, beam propagation anywhere within the stripe tends to become spread out by the local grating divergence.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DESCRIPTION

Figure 2:
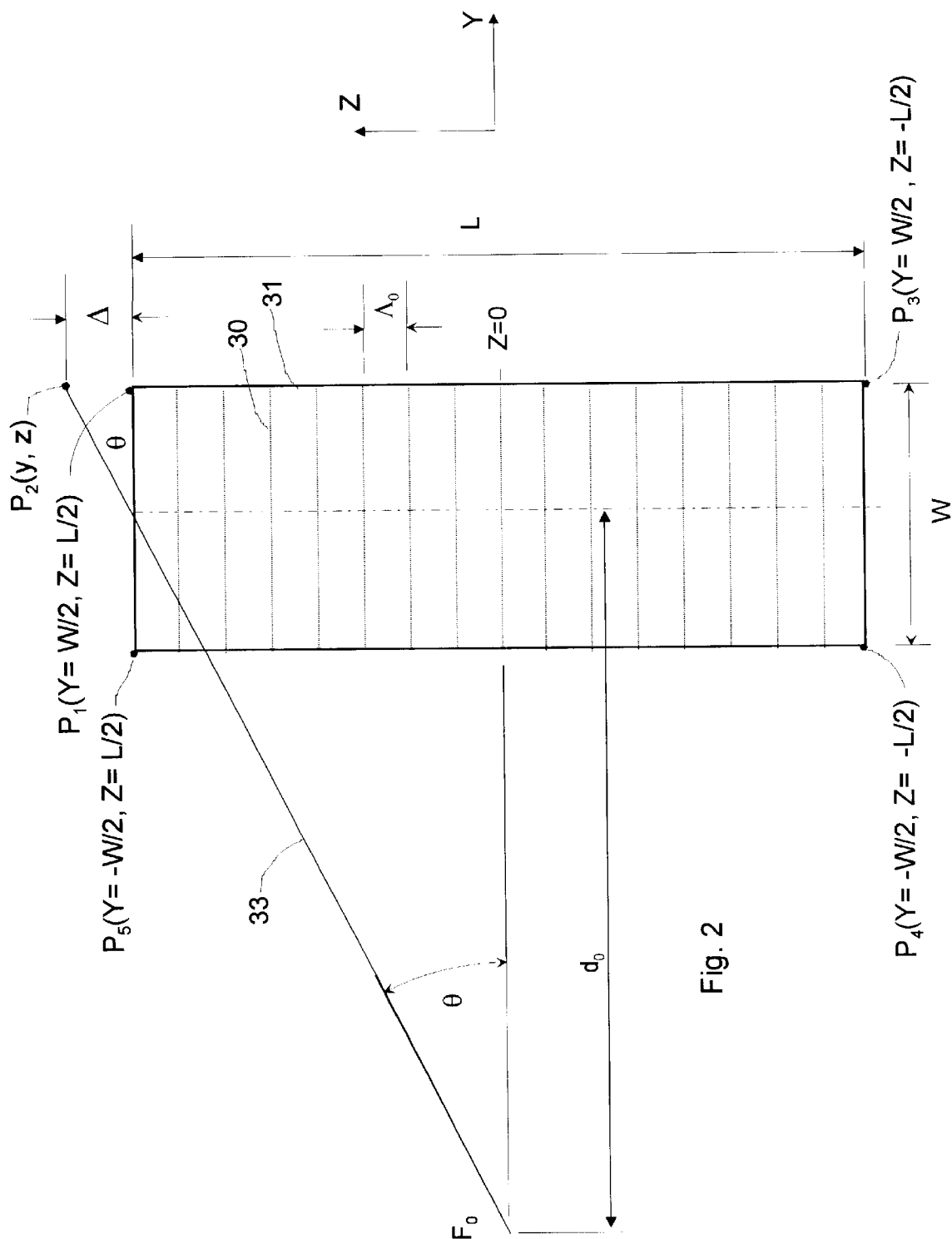
FIG. 2 depicts the criteria for constructing a fan-shaped, straight line grating in accordance with the principles of the present invention.

FIGS. 1a through 1d having been sufficiently discussed above, reference will now be made now to FIG. 2. The stripe 31 has a width W and a length L which in an illustrative surface emitting laser may be 5000 $\mu$m, and a width W, which illustratively may be 200 $\mu$m. Ordinarily, a grating would consist of parallel ruled lines 30 separated from each at intervals of the operating wavelength, $\Lambda_0$. At an illustrative operating wavelength $\Lambda_0$=800 nm, there would conventionally be several thousand such ruled lines in the 5 mm length L.

It is conventional practice to designate the long dimension L of stripe 31 as being aligned with the Z axis and the width dimension W as being aligned with the Y axis. Designating the origin at the center of the gain region, the coordinates of the top right hand corner $P_1$ are y=W/2, z=L/2 and those of the bottom right hand corner $P_3$ are (y=W/2, z=−L/2). If parallel ruled gratings 30 were used, grating lines might be expected to pass through points $P_1$ and $P_3$.

In accordance with the invention, the grating line that would pass through point P1, for example is "distorted" so that instead of being parallel to the Y axis grating line 33 now lies at an angle to the Y axis and is displaced from point $P_1$ to point $P_2$ by a distance $\Delta$. A nominal desired value for $\Delta$ is about 5 $\Lambda_0$ (illustratively, 1.25 $\mu$m) away. Grating lines 33 fan out from an origin $F_0$ located some distance $d_0$ away from the center of gain region 31. The maximum actual fan angle $\theta$ that is desired is quite small, illustratively approximately 1.0 degree. The fan shape, as drawn, is thus shown greatly exaggerated for the purpose of visualization.

To construct the fan grating, the point $F_0$ and the distance d0 can be determined from the relationship:

$$\tan\theta = \frac{\Delta}{W/2} \approx \frac{L/2}{d_0}, \text{ or} \quad (2)$$

$$d_0 = \left(\frac{L/2}{\Delta}\right) W/2 = \frac{LW}{4\Delta}. \quad (3)$$

Figure 1A:
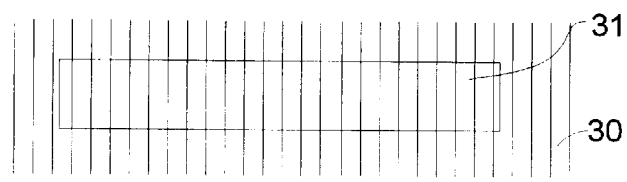
FIGS. 1a through 1d depict various prior art grating patterns that have been employed in fabricating broad area surface emitting distributed feedback semiconductor laser diode devices.
Figure 1B:
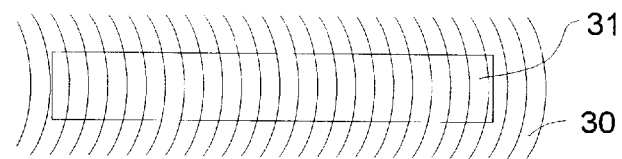
Figure 1C:
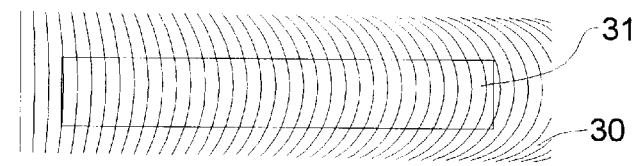
Figure 1D:
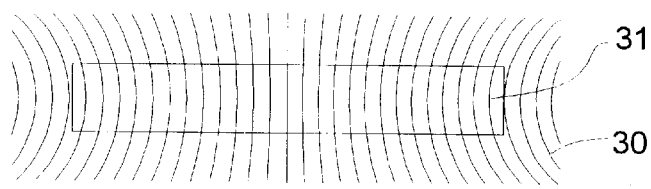
Figure 3:
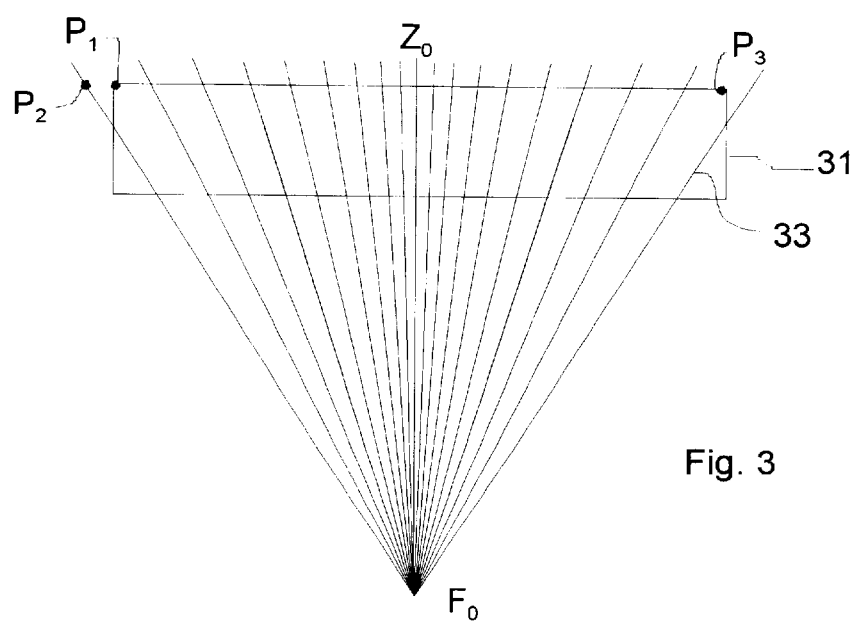
FIG. 3 depicts the fan shaped grating of the invention.

By way of illustration, using L=5000 $\mu$m, W=200 $\mu$m, and $\Delta$=5$\Lambda_0$=1.25 $\mu$m, $d_0$=200,000 $\mu$m, or 20 cm and from (2), tan $\theta$=0.01250 and $\theta$ is less than one degree. In other words, point $F_0$ is located a substantial multiple of the longitudinal dimension L away from the gain center of stripe 31. As shown in FIG. 3, the grating 33 may be constructed from point $F_0$ with an initial line $F_0$–$Z_0$ along the Y axis perpendicular to the longitudinal dimension L with succeeding lines radiating at increasing angles to points P2 and P3, respectively. Alternatively, the succeeding lines may radiate at constant increments of angle from the $F_0$–$Z_0$ line.

The fan grating may be characterized as a distortion from a straight line grating by the fraction $\Delta/\Lambda_0$ or as phase distortion $\Phi$=2$\pi\Delta/\Lambda_0$ radians. Stated differently, the distortion at any point (y, z) is a function of the product of the ratios of z to L/2 and y to W/2:

$$\frac{\Delta}{\Lambda_0} = \left(\frac{z}{L/2}\right)\left(\frac{y}{W/2}\right) \quad (4)$$

A series approximation to the distortion function (4) comprises a constant coefficient term $a_{11}$ and a variable yz term. In a practical application, the grating deformation function may also include chirp $z^2$, and aberration correction terms such as $z^3$, $zy^2$, $zy^4$, $z^3y^2$, etc. Thus there has been described a new and improved surface-emitting distributed feedback laser having a fan-shaped grating whose center of curvature is remote from the stripe's center of gain. It is to be understood that such gratings may be fabricated by any well-known holographic or surface etching techniques that may be employed in the batch processing of laser. The above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A surface emitting distributed feedback laser having a gain stripe region and a grating, the improvement wherein the grating comprises a series of lines radiating from a point located a substantial multiple of the gain stripe's longitudinal dimension away from the center of stripe gain.

2. A surface emitting distributed feedback laser according to claim 1 wherein said lines radiating from said point are substantially straight lines.

3. A surface emitting distributed feedback laser according to claim 2 wherein only one of said straight lines is perpendicular to the longitudinal dimension of said stripe and none of said lines is parallel to any other of said lines.

4. A surface emitting distributed feedback laser according to claim 3 wherein said others of said lines radiate from said point at increasing angles from said one line.

5. A surface emitting distributed feedback laser according to claim 3 wherein the distortion of said radiating lines from a conventional grating having parallel lines all drawn perpendicular to said longitudinal dimension is $\Delta/\Lambda_0$, where $\Lambda_0$ is the operating wavelength of said laser and $\Delta$ is a multiple of $\Lambda_0$.

6. A surface emitting distributed feedback laser according to claim 5 wherein $\Delta$ has a value in the range from 1 to 10.

7. A surface emitting distributed feedback laser according to claim 6 wherein said deformation is a function of (y, z) having a dominant term yz, wherein z is coordinate along a longitudinal axis of the gain medium and y is a coordinate along a transverse axis of the gain medium.

8. A surface emitting distributed feedback laser according to claim 7 wherein said deformation function include terms having multiple powers of y and z.

9. A surface-emitting distributed feedback laser having a fan-shaped grating covering the gain stripe area of said laser, said grating comprising a group of generally straight lines fanning out from an apex located away from the center of the gain.

10. A surface-emitting distributed feedback laser according to claim 9 wherein the angle between the first and last of said lines at said apex does not exceed one degree.

* * * * *